(12) United States Patent
Yang

(10) Patent No.: US 12,685,139 B2
(45) Date of Patent: Jul. 14, 2026

(54) INTERCONNECTION STRUCTURE AND METHOD FOR MANUFACTURING THE SAME

(71) Applicant: NANYA TECHNOLOGY CORPORATION, New Taipei (TW)

(72) Inventor: Zih-Hong Yang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 464 days.

(21) Appl. No.: 18/134,529

(22) Filed: Apr. 13, 2023

(65) Prior Publication Data

US 2024/0347451 A1 Oct. 17, 2024

(51) Int. Cl.
| | |
|---|---|
| *H01L 23/528* | (2006.01) |
| *H01L 21/768* | (2006.01) |
| *H01L 23/522* | (2006.01) |

(52) U.S. Cl.
CPC .... *H01L 23/5283* (2013.01); *H01L 21/76804* (2013.01); *H01L 21/76831* (2013.01); *H01L 21/76877* (2013.01); *H01L 23/5226* (2013.01)

(58) Field of Classification Search
CPC ............. H01L 23/5226; H01L 23/5328; H01L 23/53295; H01L 23/53238; H01L 21/76804; H01L 21/76877; H01L 21/76831; H01L 21/76802
See application file for complete search history.

(56) References Cited

U.S. PATENT DOCUMENTS

| | | | | |
|---|---|---|---|---|
| 6,841,477 B1 * | 1/2005 | Uchibori | ............. | H01L 21/7681 |
| | | | | 438/533 |
| 2004/0238964 A1 * | 12/2004 | Kawano | ........... | H01L 21/76804 |
| | | | | 257/E21.585 |
| 2012/0322261 A1 | 12/2012 | Shue et al. | | |
| 2017/0287841 A1 | 10/2017 | Fang et al. | | |
| 2020/0035779 A1 * | 1/2020 | Huang | ............. | H01L 21/31116 |

(Continued)

FOREIGN PATENT DOCUMENTS

| | | |
|---|---|---|
| CN | 115274616 A | 11/2022 |
| TW | 201901752 A | 1/2019 |
| TW | 201901870 A | 1/2019 |

(Continued)

OTHER PUBLICATIONS

Office Action mailed on Oct. 3, 2023 related to Taiwanese Application No. 112129306.

(Continued)

*Primary Examiner* — John M Parker
(74) *Attorney, Agent, or Firm* — Xuan Zhang

(57) ABSTRACT

An interconnection structure and a method of manufacturing an interconnection structure are provided. The interconnection structure includes a first dielectric layer, a second dielectric layer disposed on the first dielectric layer, and a first conductive layer disposed in the first dielectric layer. The interconnection structure also includes a conductive via electrically connected with the first conductive layer and extending through the first dielectric layer and the second dielectric layer. The conductive via has a first lateral surface surrounded by the first dielectric layer and a second lateral surface surrounded by the second dielectric layer. The first lateral surface and the second lateral surface have different slopes.

16 Claims, 11 Drawing Sheets

(56)                    References Cited

U.S. PATENT DOCUMENTS

| 2022/0108919 | A1 |   | 4/2022 | Wang et al. |
| 2023/0037554 | A1 | * | 2/2023 | Li ...................... H01L 21/7682 |

FOREIGN PATENT DOCUMENTS

| TW | 201911435 | A | 3/2019 |
| TW | 201911482 | A | 3/2019 |
| TW | 202106132 | A | 2/2021 |

OTHER PUBLICATIONS

Office Action mailed on Dec. 6, 2023 related to Taiwanese Application No. 112129306.
Office Action and the search report mailed on May 17, 2024 related to Taiwanese Application No. 113112274.

* cited by examiner

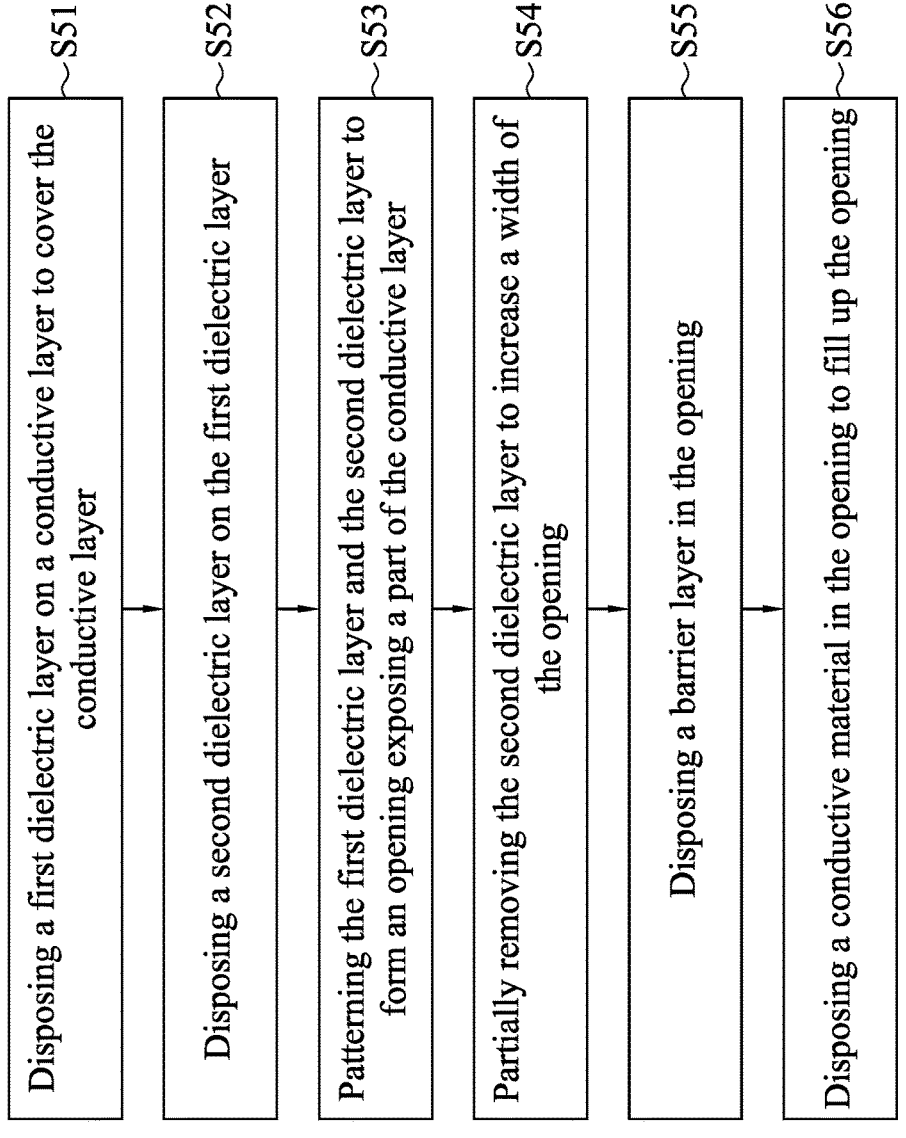

S51 — Disposing a first dielectric layer on a conductive layer to cover the conductive layer S52 — Disposing a second dielectric layer on the first dielectric layer S53 — Patterning the first dielectric layer and the second dielectric layer to form an opening exposing a part of the conductive layer S54 — Partially removing the second dielectric layer to increase a width of the opening S55 — Disposing a barrier layer in the opening S56 — Disposing a conductive material in the opening to fill up the opening

INTERCONNECTION STRUCTURE AND METHOD FOR MANUFACTURING THE SAME

TECHNICAL FIELD

The present disclosure relates to an interconnection structure and a method for manufacturing an interconnection structure, and more particularly, to an interconnection structure having a wider conductive via to reduce resistance.

DISCUSSION OF THE BACKGROUND

A variety of metallization layers comprising interconnection structures are formed over a substrate of a semiconductor device. The interconnection structures may include lateral interconnection structures such as conductive layers and vertical interconnection structures such as conductive vias.

To accomplish high integration density of a semiconductor device, dimensions of the conductive layers and the conductive vias are reduced. However, electrical resistance of the conductive layers and the conductive vias may inevitably be increased, thus diminishing device performance.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides an interconnection structure. The interconnection structure includes a first dielectric layer, a second dielectric layer disposed on the first dielectric layer, and a first conductive layer disposed in the first dielectric layer. The interconnection structure also includes a conductive via electrically connected with the first conductive layer and extending through the first dielectric layer and the second dielectric layer. The conductive via has a first lateral surface surrounded by the first dielectric layer and a second lateral surface surrounded by the second dielectric layer. The first lateral surface and the second lateral surface have different slopes.

Another aspect of the present disclosure provides an interconnection structure. The interconnection structure includes a first dielectric layer, a second dielectric layer disposed on the first dielectric layer, and a first conductive layer disposed in the first dielectric layer. The interconnection structure also includes a conductive via electrically connected with the first conductive layer and extending through the first dielectric layer and the second dielectric layer. The greatest width of the conductive via is greater than 2.5 times the smallest width of the conductive via.

Another aspect of the present disclosure provides a method of manufacturing an interconnection structure. The method includes disposing a first dielectric layer on a conductive layer to cover the conductive layer and disposing a second dielectric layer on the first dielectric layer. The method also includes patterning the first dielectric layer and the second dielectric layer to form an opening exposing a part of the conductive layer. The method also includes partially removing the second dielectric layer to increase a width of the opening. The method also includes disposing a barrier layer in the opening and disposing a conductive material in the opening to fill up the opening.

The width of the contact area (or landing area) between the conductive via disposed in the opening and the conductive layer below the conductive via is a critical dimension. By forming an opening with a smaller critical dimension and then increasing a dimension of a top portion of the opening, the dimension of the contact area between the conductive via and the conductive layer can be reduced while the resistance of the conductive via remains substantially unchanged. Therefore, the device can be further miniaturized without diminishing device performance.

In addition, since the dimension of the top portion of the opening is increased in a cleaning operation for removing impurities generated after an operation of forming the opening, no other additional operation is needed. Specifically, the present disclosure uses a cleaning solution having a higher etch selectivity (e.g., having a faster etch rate relative to an oxide and a slower etch rate relative to a nitride) to keep the smaller critical dimension of the contact area between the conductive via and the conductive layer and to gain a larger volume of the conductive via to reduce resistance.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 5 illustrates a flow chart of a method of manufacturing an interconnection structure in accordance with some embodiments of the present disclosure.

DETAILED DESCRIPTION

Figure 1:
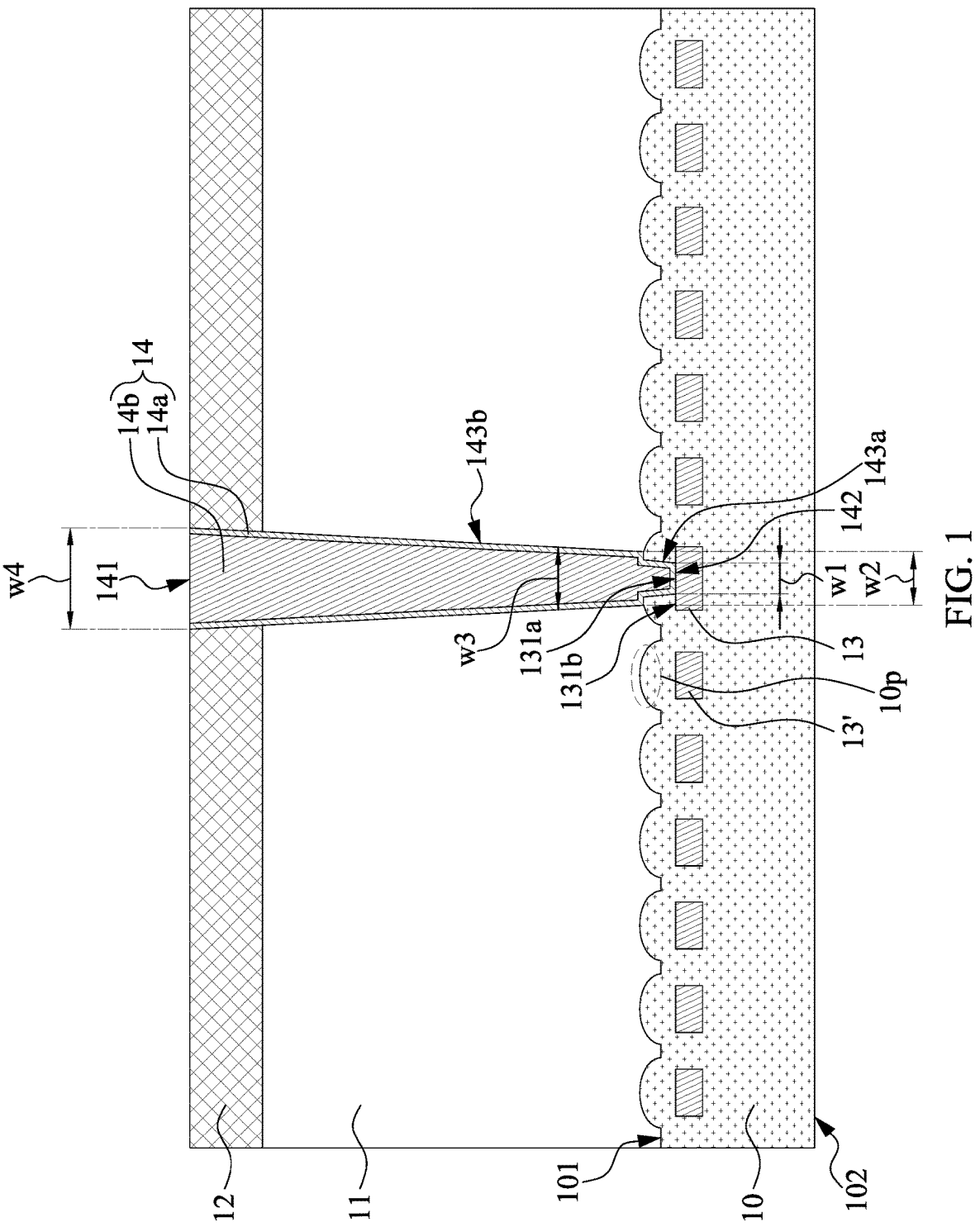
FIG. 1 is a schematic cross-sectional view of an interconnection structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of an interconnection structure 1 in accordance with some embodiments of the present disclosure. In some embodiments, the interconnection structure 1 may include a circuit, such as a memory cell. In some embodiments, the memory cell may include a dynamic random access memory cell (DRAM cell). In some embodiments, the interconnection structure 1 may be a part of one or more metallization layers over a substrate of a semiconductor device. It is contemplated that more inter-metal dielectric layers and the associated conductive layers and conductive vias may be formed over the interconnection structure 1.

In addition, the interconnection structure 1 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

As shown in FIG. 1, in some embodiments, the interconnection structure 1 may include dielectric layers 10, 11, and 12, conductive layers 13 and 13', and a conductive via 14.

In some embodiments, the interconnection structure 1 may be disposed over a substrate (not illustrated in the figures). In some embodiments, the substrate may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some other embodiments, the substrate may include a semiconductor-on-insulator substrate, such as a silicon-on-insulator (SOI) substrate, a silicon germanium-on-insulator (SGOI) substrate, or a germanium-on-insulator (GOI) substrate.

Depending on the IC fabrication stage, the substrate may include various material layers (e.g., dielectric layers, semiconductor layers, and/or conductive layers) configured to form IC features (e.g., doped regions, isolation features, gate features, source/drain features, interconnect features, other features, or combinations thereof).

The dielectric layer 10 may have a surface 101 and a surface 102 opposite to the surface 101. The surface 102 of the dielectric layer 10 may face and contact the substrate. The surface 101 of the dielectric layer 10 may face and contact the dielectric layer 11. For example, the surface 101 of the dielectric layer 10 may directly contact the dielectric layer 11.

The dielectric layer 11 may be disposed on the dielectric layer 10. The dielectric layer 12 may be disposed on the dielectric layer 11. The dielectric layer 12 may be disposed over and spaced apart from the dielectric layer 10. The dielectric layers 10, 11, and 12 may be stacked over one another along a stacking direction. In some embodiments, the stacking direction may be substantially perpendicular to a surface 102 of the dielectric layer 10.

In some embodiments, the dielectric layers 10, 11, and 12 may each include a suitable dielectric material. For example, the dielectric layers 10, 11, and 12 may be chosen based on one or more selective etching operations, which may be further described below with respect to FIG. 4B and FIG. 4C. For example, the dielectric layers 10, 11, and 12 may have different etching rates with respect to an etchant.

For example, the dielectric layer 10 may include silicon nitride ($Si_3N_4$), silicon oxynitride ($N_2OSi_2$), silicon nitride oxide ($N_2OSi_2$), tantalum pentoxide ($Ta_2O_5$). aluminum oxide ($Al_2O_3$), strontium bismuth tantalum oxide ($SrBi_2Ta_2O_9$, SBT), barium strontium titanate oxide (BaSrTiO$_3$, BST), or a combination thereof. In some embodiments, the dielectric layer 10 may include a dielectric material having a dielectric constant that is higher than that of silicon dioxide ($SiO_2$), or a dielectric material having a dielectric constant of about 4.0 or greater. In some embodiments, the dielectric layer 10 may have a single-layer structure. In some embodiments, the dielectric layer 10 may have a plurality of layers stacked on one another.

In some embodiments, the dielectric layer 11 may include, for example, silicon oxide ($SiO_2$), hafnium silicate ($HfSiO_x$), hafnium oxide ($HfO_2$), zirconium silicate ($ZrSiO_x$), zirconium oxide ($ZrO_2$), or a combination thereof. In some embodiments, the dielectric layer 11 may have a single-layer structure. In some embodiments, the dielectric layer 11 may have a plurality of layers stacked on one another.

In some embodiments, the dielectric layer 12 may include, for example, a mask layer, such as a polysilicon mask layer or a silicon-containing mask layer. In some embodiments, the dielectric layer 12 may have a single-layer structure. In some embodiments, the dielectric layer 12 may have a plurality of layers stacked on one another.

One or more conductive layers (or metal lines), such as the conductive layers 13 and 13', may be disposed in the dielectric layer 10. For example, the conductive layers 13 and 13' may be embedded in the dielectric layer 10. In some embodiments, conductive layers 13 and 13' may be partially exposed from the dielectric layer 10 to form electrical connections with the above conductive vias. For example, the conductive layer 13 may have a top surface. The top surface of the conductive layer 13 has a portion 131a contacting the conductive via 14 and a portion 131b contacting the dielectric layer 10. The portion 131a may be covered by the conductive via 14 and the portion 131b may be covered by the dielectric layer 10. The portion 131a may be exposed from the dielectric layer 10. The portion 131a may be the interface between the conductive layer 13 and the conductive via 14. The portion 131a may be surrounded by the portion 131b.

The conductive layer 13 may be spaced apart from the conductive layer 13'. A width of the conductive layer 13 may be greater than a width of the conductive layer 13' from a cross-sectional view. The conductive layer 13 may be electrically connected with the conductive via 14. The conductive layer 13' may be electrically connected with another conductive via.

In some embodiments, the conductive layers 13 and 13' may each include a suitable conductive material. For example, the conductive layers 13 and 13' may each include tungsten (W), copper (Cu), aluminum (Al), silver (Ag), an alloy thereof, or a combination thereof.

It should be noted that the number, the location, the spacing, and/or the dimension of the conductive layers in the interconnection structure 1 are not limited to the specific example illustrated in FIG. 1. For example, the interconnection structure 1 could accommodate any number of conductive layers. The location, the spacing, and/or the dimension of the conductive layers can be varied based on design requirements.

In some embodiments, the surface 101 of the dielectric layer 10 may be non-planar, bumpy, or uneven. For example, the surface 101 of the dielectric layer 10 may be conformal to the contours of the conductive layers (including the conductive layers 13 and 13') in the dielectric layer 10. For example, the dielectric layer 10 may include a protruding portion 10p over the conductive layer 13'. The protruding portion 10p may protrude from the surface 101 of the dielectric layer 10 to the dielectric layer 11.

The conductive via 14 may be disposed in each of the dielectric layers 10, 11, and 12. For example, the conductive via 14 may be accommodated in an opening defined by the dielectric layers 10, 11, and 12. For example, the conductive via 14 may penetrate through each of the dielectric layers 10, 11, and 12. For example, the conductive via 14 may be surrounded by each of the dielectric layers 10, 11, and 12. For example, the conductive via 14 may contact each of the dielectric layers 10, 11, and 12.

In some embodiments, a surface 142 (or an end) of the conductive via 14 may contact the conductive layer 13, and an opposite surface 141 (or an opposite end) of the conductive via 14 may be substantially coplanar with a surface of the dielectric layer 12. The surface 141 of the conductive via 14 may be exposed from the dielectric layer 12.

In some embodiments, the conductive via 14 may include a lateral surface 143a and a lateral surface 143b connected between the surface 141 and the surface 142. The lateral surface 143a may be connected between the surface 142 and the lateral surface 143b. The lateral surface 143b may be connected between the surface 141 and the lateral surface 143a. The lateral surface 143a may be covered, surrounded, or contacted by the dielectric layer 10. The lateral surface 143b may be covered, surrounded, or contacted by the dielectric layer 11.

In some embodiments, the slope of the lateral surface 143a and the slope of the lateral surface 143b may be different.

In some embodiments, the conductive via 14 may include a barrier layer 14a and a conductive layer 14b. The barrier layer 14a may surround the conductive layer 14b. The barrier layer 14a may directly contact the interior surfaces of the opening defined by the dielectric layers 10, 11, and 12. For example, the barrier layer 14a may be disposed between the conductive layer 14b and each of the dielectric layers 10, 11, and 12. In some embodiments, the barrier layer 14a may directly contact the conductive layer 13. For example, the barrier layer 14a may be disposed between the conductive layer 14b and the conductive layer 13.

In some embodiments, the barrier layer 14a may prevent the conductive material of the conductive layer 14b from diffusing into the adjacent dielectric layers (such as the dielectric layers 10, 11, and 12). In some embodiments, the barrier layer 14a may include a suitable conductive material such as titanium (Ti), titanium nitride (TiN), manganese (Mn), an alloy thereof, or a combination thereof.

Furthermore, a seed layer (not illustrated in the figures) may be formed over the barrier layer 14a in accordance with various embodiments. The seed layer may include a suitable conductive material such as copper (Cu), nickel (Ni), gold (Au), an alloy thereof, or a combination thereof. In addition, the seed layer may be alloyed with a material that improves the adhesive properties of the seed layer so that it can act as an adhesion layer. For example, the seed layer may be alloyed with a suitable material such as manganese (Mn), aluminum (Al), or the like, which will migrate to the interface between the seed layer and the barrier layer 14a and will enhance the adhesion between these two layers.

In some embodiments, the conductive layer 14b may include tungsten (W), copper (Cu), aluminum (Al), silver (Ag), an alloy thereof, or a combination thereof. In some embodiments, the conductive layer 13 and the conductive layer 14b may include the same material.

In some embodiments, a dimension w1 (such as a width or a diameter) of the interface (e.g., the portion 131a) between the conductive layer 13 and the conductive via 14 may be less than about 50.0 nanometers (nm). For example, the dimension w1 may be between about 30.0 nm and about 40.0 nm, such as about 35.0 nm. In some embodiments, the dimension w1 may be the smallest dimension of the conductive via 14.

In some embodiments, a dimension w2 (such as a width or a diameter) of the conductive via 14 measured along an interface between the dielectric layer 10 and a dielectric layer 11 may be less than 65.0 nm. For example, the dimension w2 may be between about 45.0 nm and about 55.0 nm, such as about 50.0 nm. The dimension w2 may be greater than the dimension w1.

In some embodiments, a dimension w3 (such as a width or a diameter) of the conductive via 14 spaced apart from the interface between the dielectric layer 10 and a dielectric layer 11 by about 5.0 nm may be between about 55.0 nm and about 60.0 nm. For example, the dimension w3 is about 5.0 nm from the surface 101 of the dielectric layer 10. For example, the dimension w3 is about 5.0 nm from the dimension w2. The dimension w3 may be greater than the dimension w2.

In some embodiments, a dimension w4 (such as a width or a diameter) of the surface 141 of the conductive via 14 may be between about 110.0 nm and about 115.0 nm. In some embodiments, the dimension w4 may be the greatest dimension of the conductive via 14. The dimension w4 may be greater than the dimension w3.

Figure 2A:
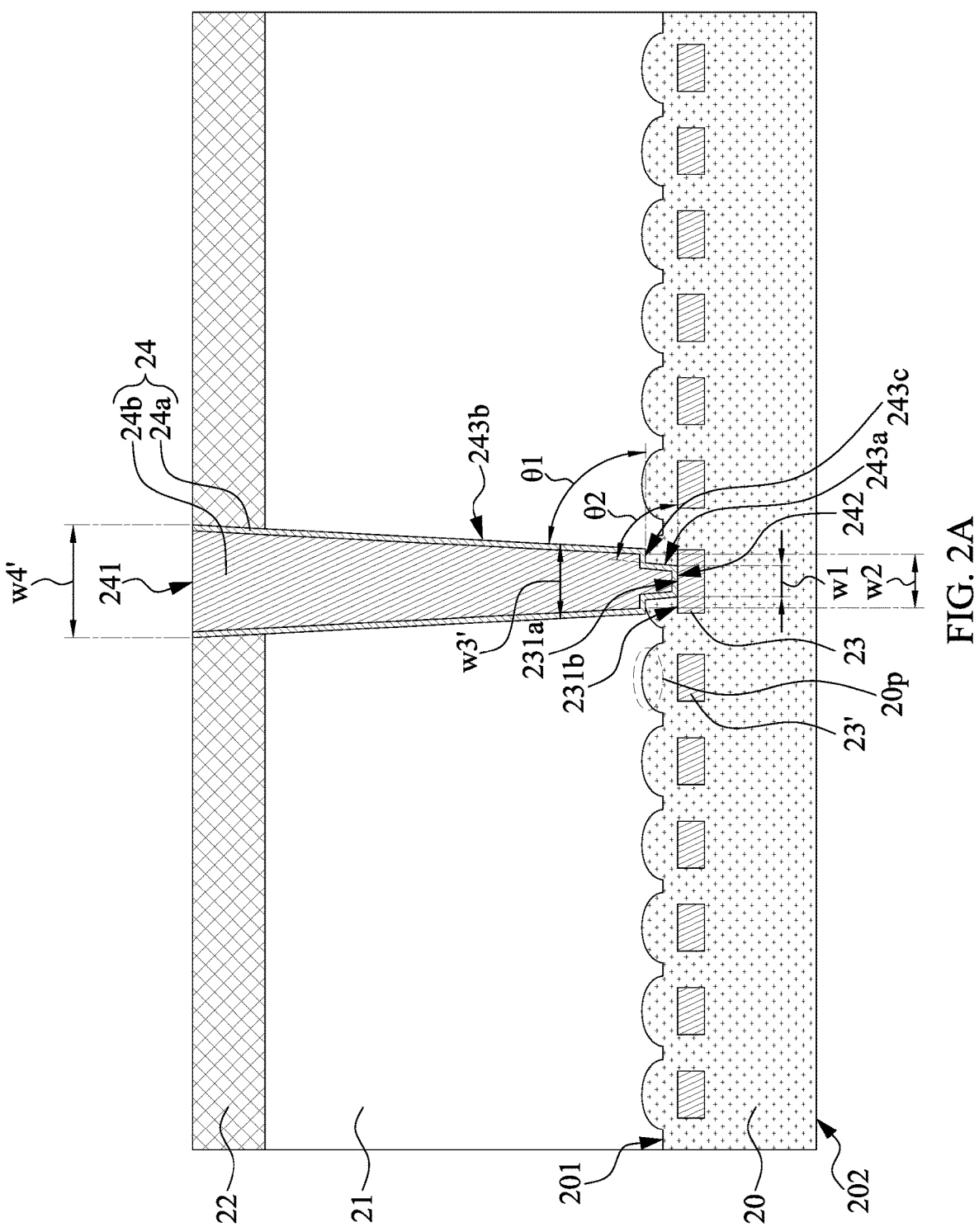
FIG. 2A is a schematic cross-sectional view of an interconnection structure in accordance with some embodiments of the present disclosure.

FIG. 2A is a schematic cross-sectional view of an interconnection structure 2 in accordance with some embodiments of the present disclosure. The interconnection structure 2 of FIG. 2A is similar to the interconnection structure 1 of FIG. 1, and the same or similar components or units are annotated with similar symbols.

As shown in FIG. 2A, in some embodiments, the interconnection structure 2 may include dielectric layers 20, 21, and 22, conductive layers 23 and 23', and a conductive via 24.

The dielectric layer 20 may have a surface 201 and a surface 202 opposite to the surface 201. The dielectric layer 21 may be disposed on the dielectric layer 20. The dielectric layer 22 may be disposed on the dielectric layer 21. The dielectric layer 22 may be disposed over and spaced apart from the dielectric layer 20.

The detailed descriptions of the dielectric layers 20, 21, and 22 may refer to the dielectric layers 10, 11, and 12, respectively, described with respect to FIG. 1.

One or more conductive layers (or metal lines), such as the conductive layers 23 and 23', may be disposed in the dielectric layer 20. For example, the conductive layers 23 and 23' may be embedded in the dielectric layer 20. In some embodiments, conductive layers 23 and 23' may be partially exposed from the dielectric layer 20 to form electrical connections with the above conductive vias. For example, the conductive layer 23 may have a top surface. The top surface of the conductive layer 23 has a portion 231a contacting the conductive via 24 and a portion 231b contacting the dielectric layer 20. The portion 231a may be covered by the conductive via 24 and the portion 231b may be covered by the dielectric layer 20. The portion 231a may be exposed from the dielectric layer 20. The portion 231a may be the interface between the conductive layer 23 and the conductive via 24. The portion 231a may be surrounded by the portion 231b.

The detailed descriptions of the conductive layers 23 and 23' may refer to the conductive layers 13 and 13', respectively, described with respect to FIG. 1.

Similarly, the surface 201 of the dielectric layer 20 may be non-planar, bumpy, or uneven. For example, the surface 201 of the dielectric layer 20 may be conformal to the contours of the conductive layers (including the conductive layers 23 and 23') in the dielectric layer 20. For example, the dielectric layer 20 may include a protruding portion 20p over the conductive layer 23'. The protruding portion 20p may protrude from the surface 201 of the dielectric layer 20 to the dielectric layer 21.

The conductive via 24 may be disposed in each of the dielectric layers 20, 21, and 22. For example, the conductive via 24 may be accommodated in an opening defined by the dielectric layers 20, 21, and 22. For example, the conductive via 24 may penetrate through each of the dielectric layers 20, 21, and 22. For example, the conductive via 24 may be surrounded by each of the dielectric layers 20, 21, and 22. For example, the conductive via 24 may contact each of the dielectric layers 20, 21, and 22.

In some embodiments, a surface 242 (or an end) of the conductive via 24 may contact the conductive layer 23 and an opposite surface 241 (or an opposite end) of the conductive via 24 may be substantially coplanar with a surface of the dielectric layer 22. The surface 241 of the conductive via 24 may be exposed from the dielectric layer 22.

In some embodiments, the conductive via 24 may include a lateral surface 243a and a lateral surface 243b connected between the surface 241 and the surface 242. The lateral surface 243a may be connected between the surface 242 and the lateral surface 243b. The lateral surface 243b may be connected between the surface 241 and the lateral surface 243a. The lateral surface 243a may be covered, surrounded, or contacted by the dielectric layer 20. The lateral surface 243b may be covered, surrounded, or contacted by the dielectric layer 21.

In comparison with the conductive via 14 of the interconnection structure 1, the conductive via 24 of the interconnection structure 2 may further include a lateral surface 243c connected between the lateral surface 243a and the lateral surface 243b. The lateral surface 243c and the lateral surface 243b may define a stepped structure. The stepped structure may be covered or surrounded by the dielectric layer 21. The stepped structure may be partially covered or surrounded by the dielectric layer 21. The lateral surface 243c and the lateral surface 243a may define a corner. The corner may be filled with the dielectric layer 22. In some embodiments, the lateral surface 243c may be substantially parallel to the surface 241 and/or the surface 242 of the conductive via 24.

In some embodiments, the slope of the lateral surface 243a and the slope of the lateral surface 243b may be different. For example, an angle θ1 defined by the lateral surface 243b and the lateral surface 243c may be different from an angle θ2 defined by the lateral surface 243a and an imaginary plane substantially parallel to the lateral surface 243c. For example, the angle θ1 may be greater than the angle θ2, or vice versa.

In some embodiments, the conductive via 24 may include a barrier layer 24a and a conductive layer 24b. The detailed descriptions of the barrier layer 24a and the conductive layer 24b may refer to the barrier layer 14a and the conductive layer 14b, respectively, described with respect to FIG. 1.

In some embodiments, as shown in FIG. 2A, the conductive via 24 may include the dimension w1 and the dimension w2, which may be the same as the dimension w1 and the dimension w2 of the conductive via 14 of the interconnection structure 1.

However, in comparison with the conductive via 14 of the interconnection structure 1, the conductive via 24 of the interconnection structure 2 has a wider upper portion.

For example, a dimension w3' (such as a width or a diameter) of the conductive via 24 may be greater than the dimension w3 of the conductive via 14. The dimension w3' may be spaced apart from the interface between the dielectric layer 20 and a dielectric layer 21 by about 5.0 nm. For example, the dimension w3' is about 5.0 nm from the surface 201 of the dielectric layer 20. For example, the dimension w3' is about 5.0 nm from the dimension w2. The dimension w3' may be between about 60.0 nm and about 70.0 nm.

For example, a dimension w4' (such as a width or a diameter) of the conductive via 24 may be greater than the dimension w4 of the conductive via 14. The dimension w4' may be between about 120.0 nm and about 125.0 nm. In some embodiments, the dimension w4' may be the greatest dimension of the conductive via 24.

In some embodiments, the dimension w4' may be greater than 2.5 times the dimension w1. For example, the dimension w4' may be greater than 3 times the dimension w1. For example, the dimension w4' may be greater than 4 times the dimension w1.

In some embodiments, the greatest dimension of the conductive via 24 may be greater than 2.5 times the smallest dimension of the conductive via 24. For example, the greatest dimension of the conductive via 24 may be greater than 3 times the smallest dimension of the conductive via 24. For example, the greatest dimension of the conductive via 24 may be greater than 4 times the smallest dimension of the conductive via 24.

To accomplish high integration density of a semiconductor device, dimensions of lateral interconnection structures (such as conductive layers) and vertical interconnection structures (such as conductive vias) are reduced. For example, the dimension w1 of FIG. 1 is reduced from about 50.0 nm to about 35 nm. However, electrical resistances of the conductive layers and the conductive vias may inevitably be increased; for example, from about 65.0 ohms ($\Omega$) to about 103.5 ohms.

According to some embodiments of the present disclosure, by forming an opening with a smaller critical dimension (e.g., the dimension w1 of FIG. 2A) and then increasing a dimension (e.g., the dimensions w4' and w3' of FIG. 2A) of a top portion of the opening, the dimension of the contact area (e.g., the portion 231*a*) between the conductive via 24 and the conductive layer 23 can be reduced while the resistance of the conductive via 24 remains substantially unchanged. For example, the dimension w1 of FIG. 2 is reduced from about 50.0 nm to about 35 nm while the resistance of the conductive via 24 remains from about 65.0 ohms to about 70.0 ohms.

Figure 4A:
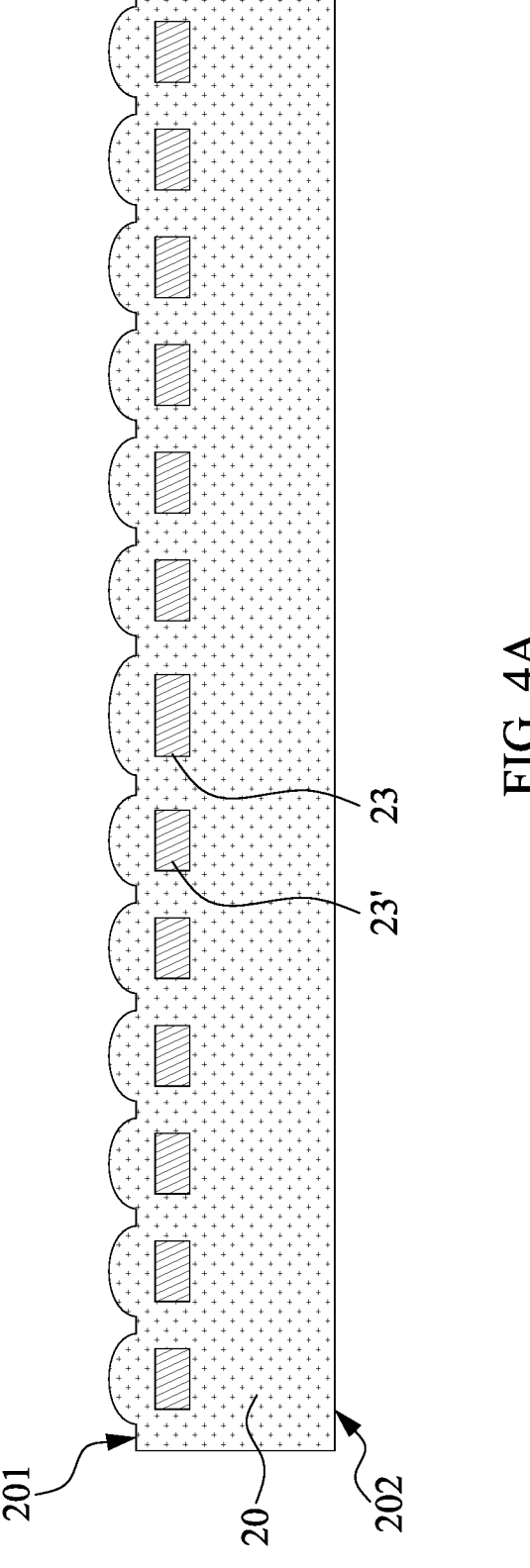
FIG. 4A illustrates one or more stages of a method of manufacturing an interconnection structure in accordance with some embodiments of the present disclosure.
Figure 4B:
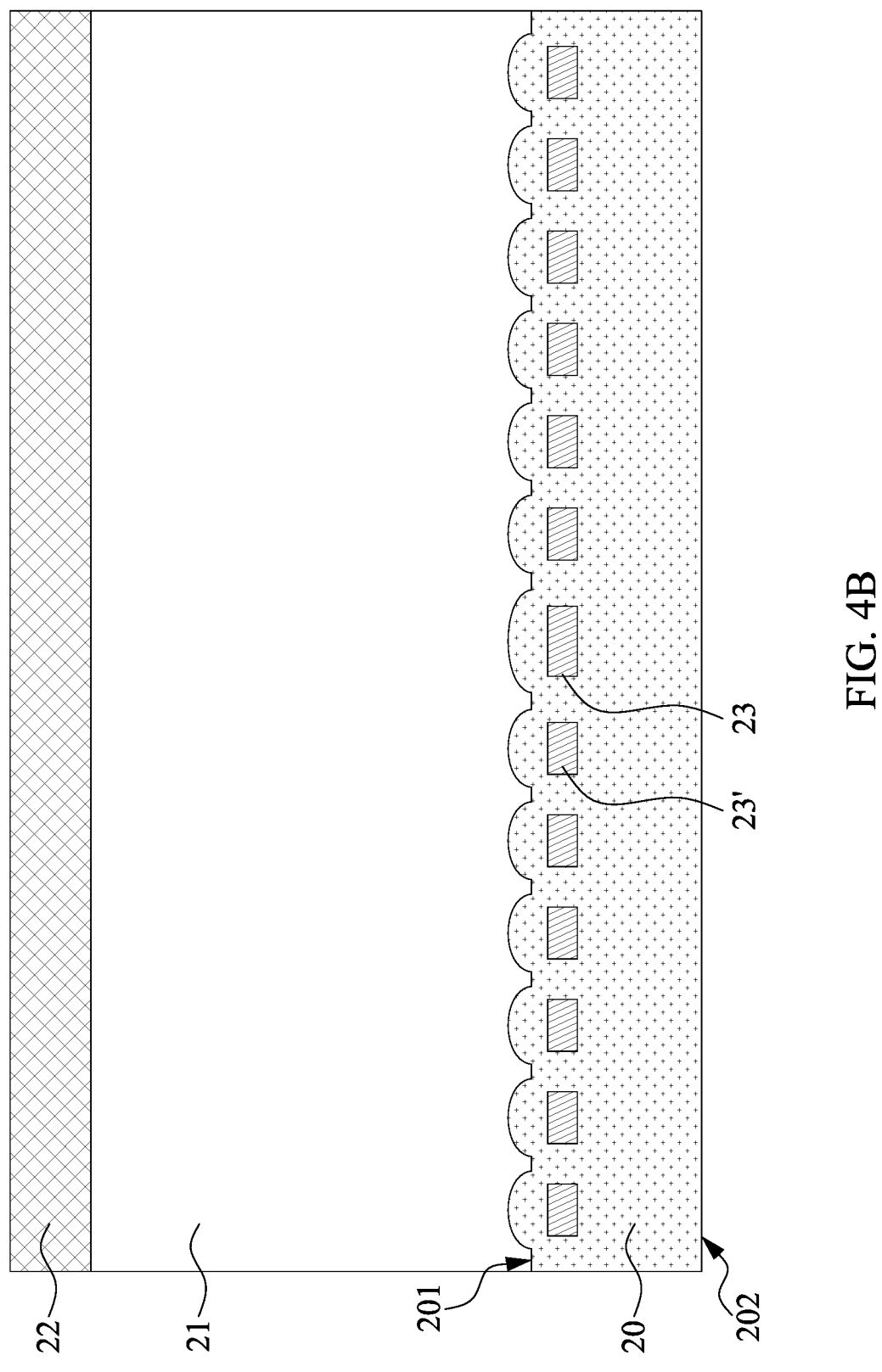
FIG. 4B illustrates one or more stages of a method of manufacturing an interconnection structure in accordance with some embodiments of the present disclosure.
Figure 4C:
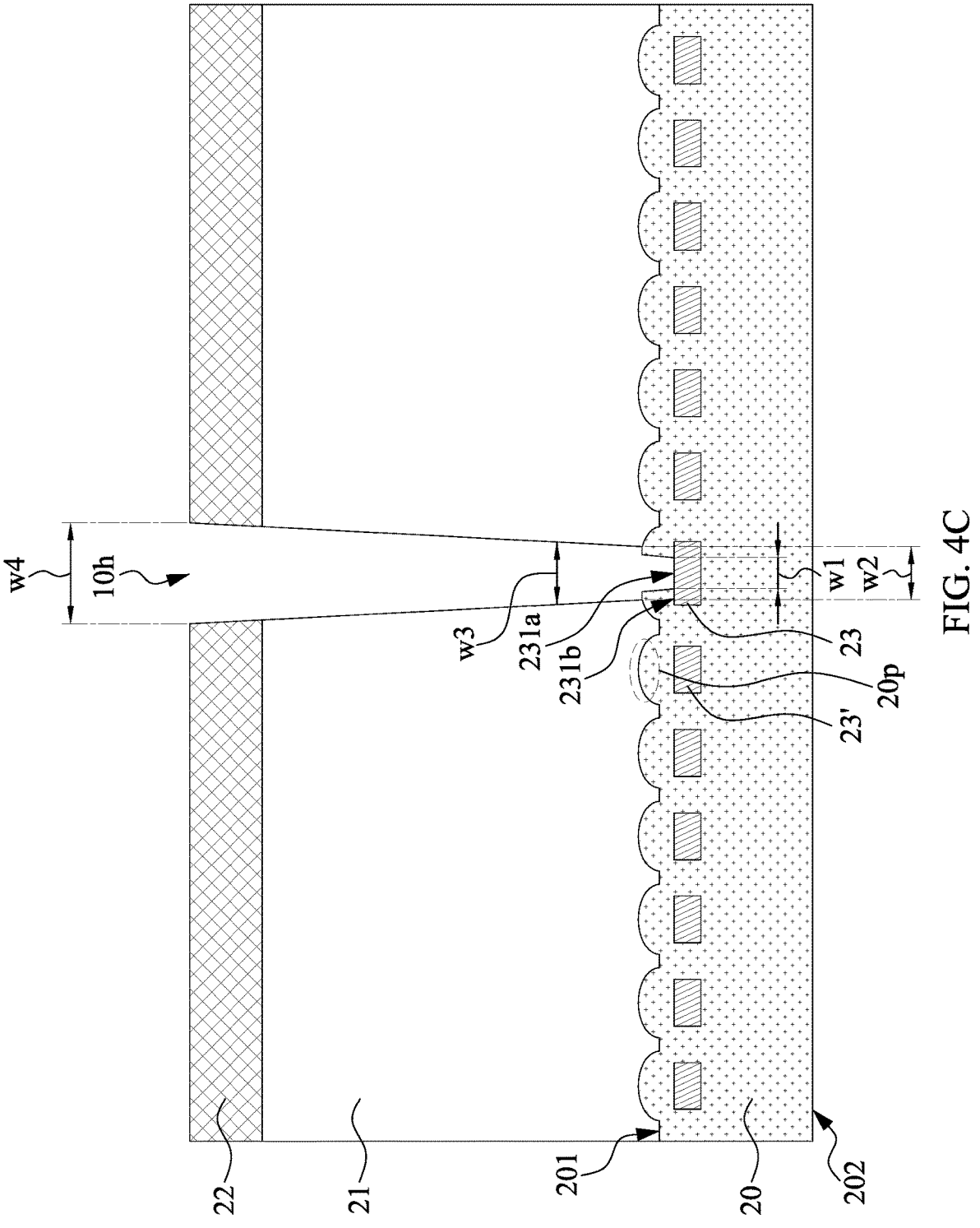
FIG. 4C illustrates one or more stages of a method of manufacturing an interconnection structure in accordance with some embodiments of the present disclosure.
Figure 4D:
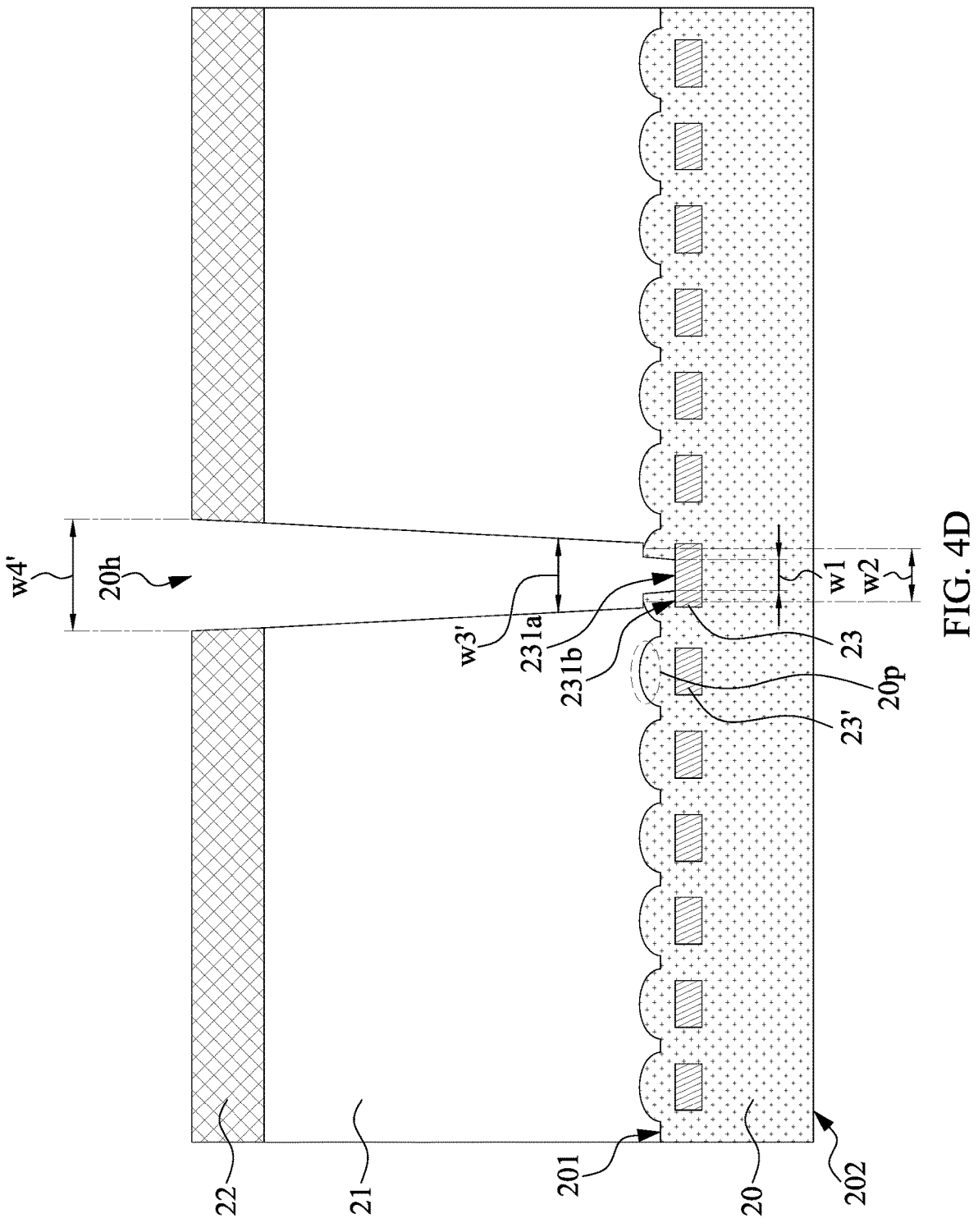
FIG. 4D illustrates one or more stages of a method of manufacturing an interconnection structure in accordance with some embodiments of the present disclosure.

In addition, since the dimension of the top portion of the opening is increased in a cleaning operation (such as shown in FIG. 4D) for removing impurities generated after an operation of forming the opening (such as shown in FIG. 4C), no other additional operation is needed. Specifically, the present disclosure uses a cleaning solution having a higher etch selectivity (e.g., having a faster etch rate relative to the dielectric layer 21 and a slower etch rate relative to the dielectric layer 20) to keep the smaller critical dimension of the contact area between the conductive via 24 and the conductive layer 23 and to gain a larger volume of the conductive via 24 to reduce resistance.

Figure 2B:
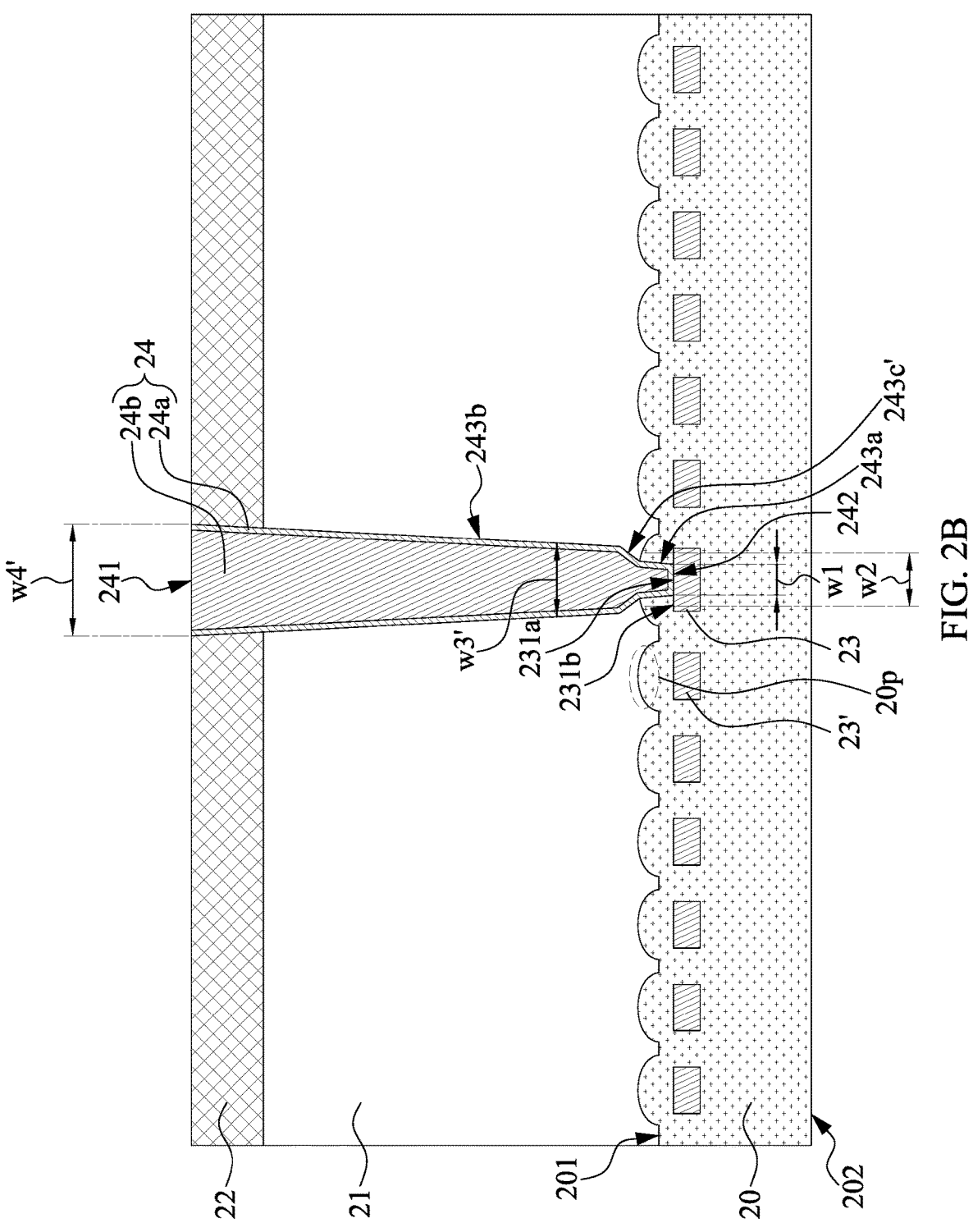
FIG. 2B is a schematic cross-sectional view of an interconnection structure in accordance with some embodiments of the present disclosure.

FIG. 2B is a schematic cross-sectional view of an interconnection structure 2' in accordance with some embodiments of the present disclosure. The interconnection structure 2' of FIG. 2B is similar to the interconnection structure 2 of FIG. 2A, except for the differences described below.

The interconnection structure 2' includes a lateral surface 243*c*' connected between the lateral surface 243*a* and the lateral surface 243*b*. The lateral surface 243*c*' and the lateral surface 243*b* may define an obtuse angle. The lateral surface 243*c*' may be non-parallel to the surface 201. The lateral surface 243*c*' may be covered by the dielectric layer 21. For example, the lateral surface 243*c*' may be entirely covered by the dielectric layer 21.

Figure 3:
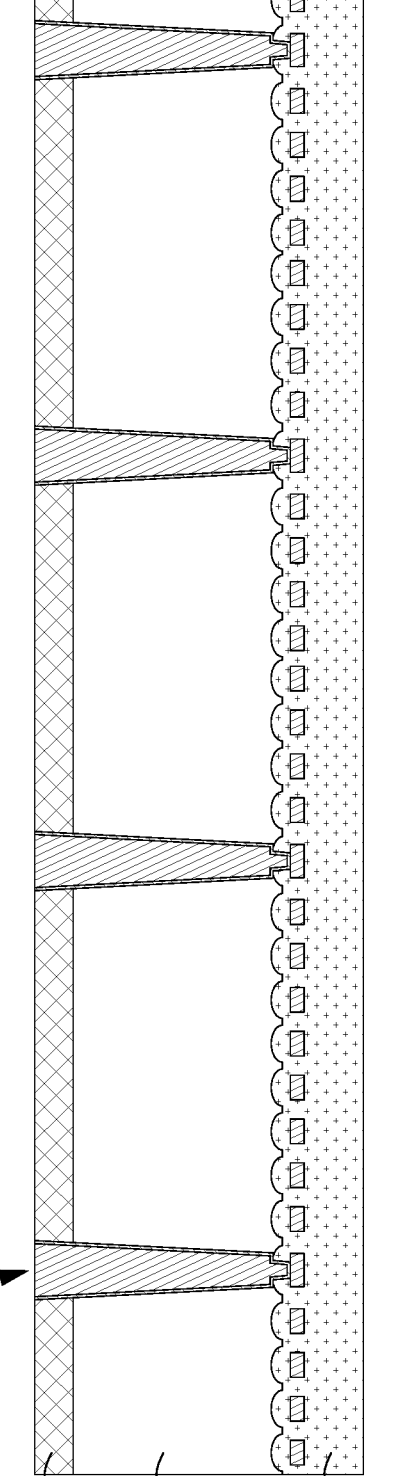
FIG. 3 is a schematic cross-sectional view of an interconnection structure in accordance with some embodiments of the present disclosure.

FIG. 3 is a schematic cross-sectional view of an interconnection structure 3 in accordance with some embodiments of the present disclosure. The interconnection structure 3 of FIG. 3 may include a plurality of the interconnection structure 2 of FIG. 2A.

In some embodiments, the interconnection structure 3 may be formed on a wafer. The dimensions w1, w2, w3', and w4' of the conductive via 24 are consistent, identical, or uniform throughout the wafer. For example, the conductive via 24 on the edge of the wafer and the conductive via 24 on the center of the wafer are substantially the same.

FIGS. 4A, 4B, 4C, 4D, 4E, and 4F illustrate stages of a method of manufacturing an interconnection structure in accordance with some embodiments of the present disclosure. At least some of these figures have been simplified for a better understanding of the aspects of the present disclosure. In some embodiments, the interconnection structure 1 in FIG. 1, the interconnection structure 2 in FIG. 2A, and the interconnection structure 2' in FIG. 2B may be manufactured by the operations described below with respect to FIGS. 4A, 4B, 4C, 4D, 4E, and 4F.

Referring to FIG. 4A, the dielectric layer 20 may be disposed on a substrate (not illustrated in the figures). The dielectric layer 20 may be disposed on the conductive layers (including the conductive layers 23 and 23'). The conductive layers may be covered by the dielectric layer 20. The surface 201 of the dielectric layer 20 may be conformal to the contours of the conductive layers. Therefore, the surface 201 of the dielectric layer 20 may be non-planar, bumpy, or uneven.

In some embodiments, the dielectric layer 20 may be formed by a thermal oxidation operation, a chemical vapor deposition (CVD) operation, a low-pressure chemical vapor deposition (LPCVD) operation, a plasma enhanced chemical vapor deposition (PECVD) operation, other feasible operations, or a combination thereof.

Referring to FIG. 4B, the dielectric layer 21 may be disposed on the surface 201 of the dielectric layer 20 and the dielectric layer 22 may be disposed on the dielectric layer 21. The dielectric layer 21 and the dielectric layer 22 may be formed by a thermal oxidation operation, a CVD operation, a LPCVD operation, a PECVD operation, other feasible operations, or a combination thereof.

Referring to FIG. 4C, the dielectric layer 22 may be patterned through a suitable photolithography process. The dielectric layer 22 may be patterned according to the location and the shape of an opening 10*h* to be formed in the dielectric layers 20, 21 and 22. The dielectric layers 20 and 21 may be etched through a wet etching or a dry etching operation. The dielectric layers 20 and 21 may be etched by using the dielectric layer 22 as a mask layer.

After the dielectric layers 20, 21 and 22 are etched, the opening 10*h* with the dimensions w1, w2, w3, and w4 are formed. The portion 231*a* of the conductive layer 23 may be exposed through the opening 10*h*. The opening 10*h* may be corresponding to the conductive via 14 in FIG. 1.

Referring to FIG. 4D, the dielectric layer 21 and the dielectric layer 22 may be partially removed to increase the dimensions of the opening 10*h*. The dimensions w3 and w4 of the opening 10*h* are increased. The opening 10*h* with the increased dimensions is annotated as the opening 20*h*. The opening 20*h* includes the dimensions w1, w2, w3', and w4'. The opening 20*h* may be corresponding to the conductive via 24 in FIG. 2A and FIG. 2B.

The dielectric layer 21 and the dielectric layer 22 may be partially removed through a cleaning operation. After the dielectric layers 20, 21 and 22 are etched, impurities may attach to the interior surfaces of the opening 10*h*. The impurities may increase electrical resistance or may cause an electrical short between adjacent conductive elements. Thus, these impurities should be removed. Therefore, no other additional operation is needed to partially remove the dielectric layer 21 and the dielectric layer 22.

In some embodiments, in the cleaning operation, the structure obtained from the operation of FIG. 4C may be immersed in a cleaning solution. In some embodiments, in the cleaning operation, the structure obtained from the operation of FIG. 4C may be immersed in a hydrofluoric acid (HF) solution diluted with deionized water in a 500:1 ratio for about 85 to about 235 seconds.

In some embodiments, the cleaning solution has a faster etch rate relative to the dielectric layer 21 and a slower etch rate relative to the dielectric layer 20. Therefore, the dielectric layer 20 may remain substantially unchanged in the cleaning operation. Therefore, the smaller critical dimension (e.g., the dimension w1) of the contact area (e.g., the portion 231*a*) can remain substantially unchanged in the cleaning operation.

Figure 4E:
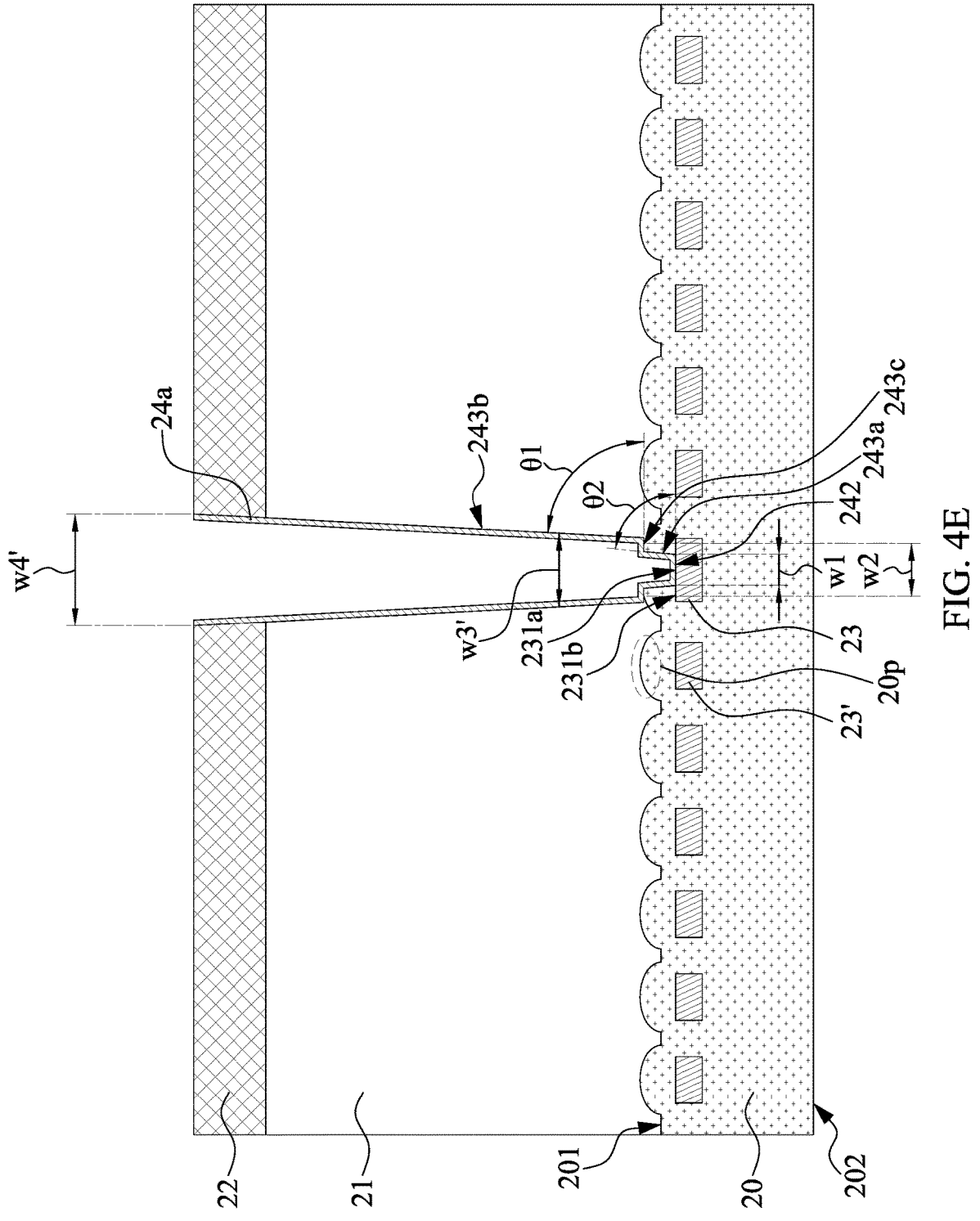
FIG. 4E illustrates one or more stages of a method of manufacturing an interconnection structure in accordance with some embodiments of the present disclosure.

Referring to FIG. 4E, a barrier layer 24*a* and/or a seed layer (not illustrated in the figures) may be disposed in the opening 20*h*. The barrier layer 24*a* may directly contact the dielectric layers 20, 21, and 22. In some embodiments, the barrier layer 24*a* may directly contact the conductive layer 23. The barrier layer 24*a* and/or a seed layer may be formed by suitable techniques such as an electroplating operation, an electroless plating operation, CVD operation, PVD operation, etc.

Figure 4F:
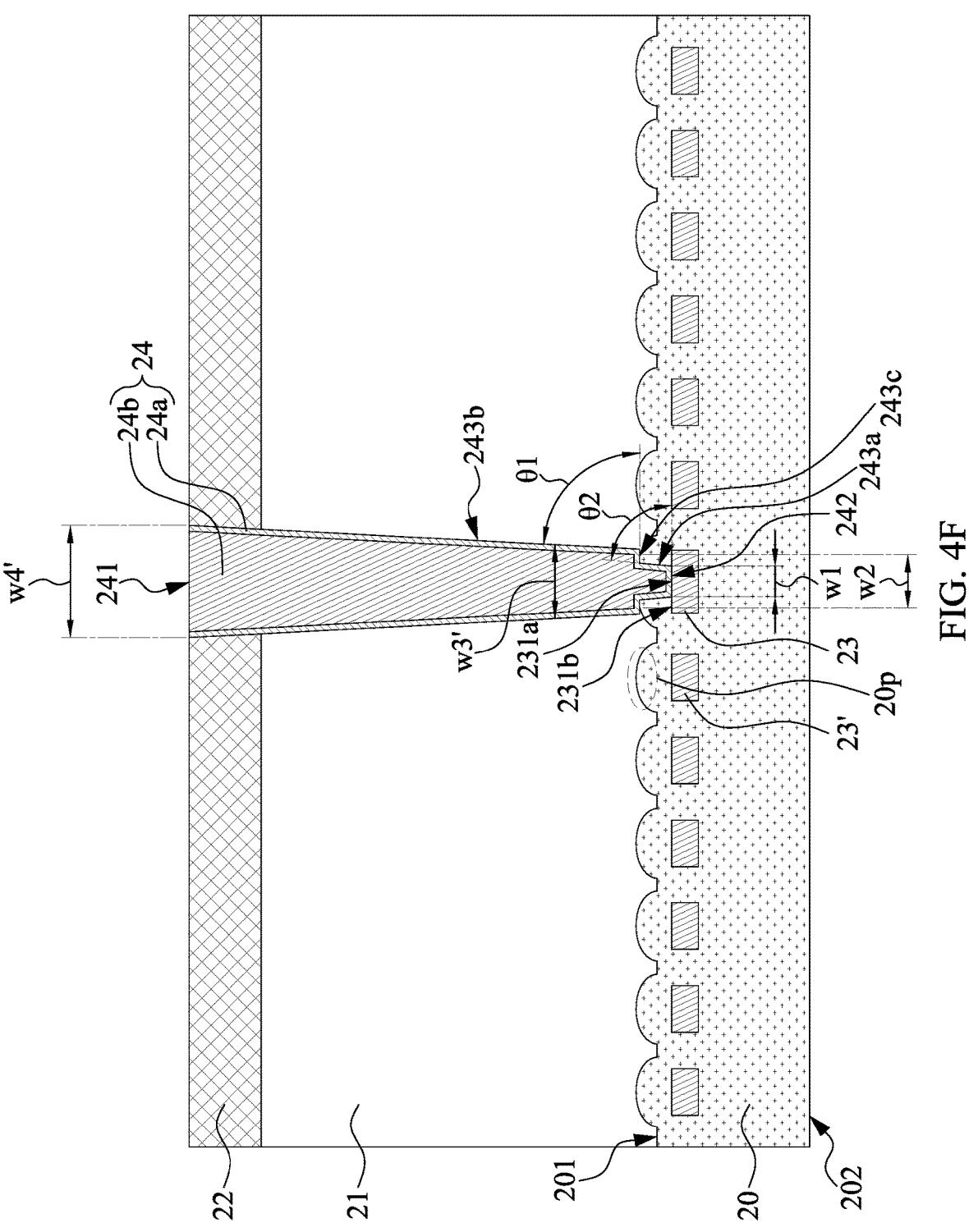
FIG. 4F illustrates one or more stages of a method of manufacturing an interconnection structure in accordance with some embodiments of the present disclosure.

Referring to FIG. 4F, a conductive material of the conductive layer 24*b* may be formed in the opening 20*h* in FIG. 4E to fill up the opening 20*h*. The conductive material of the conductive layer 24*b* may be formed by suitable techniques such as an electroplating operation, an electroless plating operation, CVD operation, PVD operation, etc.

In some embodiments, a planarization process may be performed to remove excess conductive materials. The planarization process may be implemented by using suitable techniques such as grinding, polishing, chemical etching, etc.

FIG. 5 illustrates a flow chart of a method 50 of manufacturing an interconnection structure in accordance with some embodiments of the present disclosure.

In some embodiments, the method 50 may include a step S51, disposing a first dielectric layer on a conductive layer to cover the conductive layer. For example, as shown in FIG. 4A, the dielectric layer 20 may be disposed on the conductive layers (including the conductive layers 23 and 23'). The conductive layers may be covered by the dielectric layer 20.

In some embodiments, the method 50 may include a step S52, disposing a second dielectric layer on the first dielectric layer. For example, as shown in FIG. 4B, the dielectric layer 21 may be disposed on the surface 201 of the dielectric layer 20.

In some embodiments, the method 50 may include a step S53, patterning the first dielectric layer and the second dielectric layer to form an opening exposing a part of the conductive via. For example, as shown in FIG. 4C, the dielectric layers 20 and 21 may be patterned to form the opening 10*h* exposing the portion 231*a* of the conductive layer 23.

In some embodiments, the method 50 may include a step S54, partially removing the second dielectric layer to increase a width of the opening. For example, as shown in FIG. 4D, the dielectric layer 21 is partially removed and the opening 20*h* includes the dimensions w1, w2, w3', and w4'. The dimensions w3 and w4 of the opening 10*h* in FIG. 4C are increased.

In some embodiments, the method 50 may include a step S55, disposing a barrier layer in the opening. For example, as shown in FIG. 4E, the barrier layer 24*a* is disposed in the opening 20*h*.

In some embodiments, the method 50 may include a step S56, disposing a conductive material in the opening to fill up the opening. For example, as shown in FIG. 4F, a conductive material of the conductive layer 24*b* is formed in the opening 20*h* in FIG. 4E to fill up the opening 20*h*.

One aspect of the present disclosure provides an interconnection structure. The interconnection structure includes a first dielectric layer, a second dielectric layer disposed on the first dielectric layer, and a first conductive layer disposed in the first dielectric layer. The interconnection structure also includes a conductive via electrically connected with the first conductive layer and extending through the first dielectric layer and the second dielectric layer. The conductive via has a first lateral surface surrounded by the first dielectric layer and a second lateral surface surrounded by the second dielectric layer. The first lateral surface and the second lateral surface have different slopes.

Another aspect of the present disclosure provides an interconnection structure. The interconnection structure includes a first dielectric layer, a second dielectric layer disposed on the first dielectric layer, and a first conductive layer disposed in the first dielectric layer. The interconnection structure also includes a conductive via electrically connected with the first conductive layer and extending through the first dielectric layer and the second dielectric layer. The greatest width of the conductive via is greater than 2.5 times the smallest width of the conductive via.

Another aspect of the present disclosure provides a method of manufacturing an interconnection structure. The method includes disposing a first dielectric layer on a conductive layer to cover the conductive layer and disposing a second dielectric layer on the first dielectric layer. The method also includes patterning the first dielectric layer and the second dielectric layer to form an opening exposing a part of the conductive layer. The method also includes partially removing the second dielectric layer to increase a width of the opening. The method also includes disposing a barrier layer in the opening and disposing a conductive material in the opening to fill up the opening.

The width of the contact area (or landing area) between the conductive via disposed in the opening and the conductive layer below the conductive via is a critical dimension. By forming an opening with a smaller critical dimension and then increasing a dimension of a top portion of the opening, the dimension of the contact area between the conductive via and the conductive layer can be reduced while the resistance of the conductive via remains substantially unchanged. Therefore, the device can be further miniaturized without diminishing device performance.

In addition, since the dimension of the top portion of the opening is increased in a cleaning operation for removing impurities generated after an operation of forming the opening, no other additional operation is needed. Specifically, the present disclosure uses a cleaning solution having a higher etch selectivity (e.g., having a faster etch rate relative to an oxide and a slower etch rate relative to a nitride) to keep the smaller critical dimension of the contact area between the conductive via and the conductive layer and to gain a larger volume of the conductive via to reduce resistance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An interconnection structure, comprising:
a first dielectric layer having a top surface and a first protruding portion protruding therefrom;
a second dielectric layer disposed on the top surface of the first dielectric layer, wherein the first protruding portion of the first dielectric layer is extended into the second dielectric layer;
a first conductive layer disposed in the first dielectric layer at a position that the first protruding portion of the first dielectric layer is disposed above the first conductive layer; and
a conductive via electrically connected with the first conductive layer and extending through the first dielectric layer and the second dielectric layer;
wherein the conductive via has a first lateral surface surrounded by the first dielectric layer and a second lateral surface surrounded by the second dielectric layer, the first lateral surface and the second lateral surface having different slopes;
wherein the first lateral surface of the conductive via is extended from the first conductive layer to the top surface of the first dielectric layer at the first protruding portion thereof;
wherein the second lateral surface of the conductive via is extended from the top surface of the first dielectric layer at the first protruding portion thereof through the second dielectric layer.

2. The interconnection structure of claim 1, wherein a width of an interface between the first conductive layer and the conductive via is the smallest width of the first conductive via.

3. The interconnection structure of claim 2, wherein the width of the interface is less than about 50.0 nanometers (nm).

4. The interconnection structure of claim 2, wherein the conductive via comprises a top surface, and a width of the top surface is greater than 2.5 times of the width of the interface.

5. The interconnection structure of claim 4, wherein the width of the top surface is the greatest width of the conductive via.

6. The interconnection structure of claim 4, wherein the width of the top surface is between about 120.0 nm and about 125.0 nm.

7. The interconnection structure of claim 4, further comprising:
a third dielectric layer disposed on the second dielectric layer, wherein the top surface of the conductive via is exposed from and coplanar with a top surface of the third dielectric layer.

8. The interconnection structure of claim 1, wherein the first dielectric layer and the second dielectric layer have different etching rates with respect to an etchant.

9. The interconnection structure of claim 1, wherein the first conductive layer is partially covered by the first dielectric layer, wherein a width of the first protruding portion of the first dielectric layer is conformal to a contour of the first conductive layer.

10. The interconnection structure of claim 1, further comprising:
a second conductive layer disposed in the first dielectric layer and spaced apart from the first conductive layer.

11. The interconnection structure of claim 10, wherein the first dielectric layer comprises a second protruding portion over the second conductive layer protruding into the second dielectric layer, wherein the first protruding portion and the second protruding portion are spaced apart from each other and are alignedly disposed over the first conductive layer and the second conductive layer respectively.

12. The interconnection structure of claim 1, wherein the conductive via further comprises a third lateral surface connected between the first and second lateral surfaces of the conductive via, and wherein the first lateral surface, the second lateral surface, and the third lateral surface have different slopes.

13. The interconnection structure of claim 1, wherein an electrical resistance of the conductive via is between 65.0 ohms and 70.0 ohms.

14. The interconnection structure of claim 1, wherein the conductive via comprises a barrier layer directly contacting the first dielectric layer and the second dielectric layer.

15. The interconnection structure of claim 1, wherein the conductive via further has a third lateral surface extended between the first lateral surface and the second lateral surface and defines a corner between the first lateral surface and the third lateral surface, wherein the corner is filled with the second dielectric layer.

16. The interconnection structure of claim 15, wherein the third lateral surface of the conductive via is parallel to a bottom surface of the conductive via.

* * * * *